(12) United States Patent
Yednak, III et al.

(10) Patent No.: US 12,297,540 B2
(45) Date of Patent: May 13, 2025

(54) CHEMICAL SOURCE VESSEL WITH DIP TUBE

(71) Applicant: ASM IP Holding B.V., Almere (NL)

(72) Inventors: Andrew Michael Yednak, III, Phoenix, AZ (US); Todd Robert Dunn, Cave Creek, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/242,598

(22) Filed: Sep. 6, 2023

(65) Prior Publication Data

US 2023/0407480 A1 Dec. 21, 2023

Related U.S. Application Data

(63) Continuation of application No. 16/860,973, filed on Apr. 28, 2020, now Pat. No. 11,781,221.

(Continued)

(51) Int. Cl.

| | |
|---|---|
| *C23C 16/44* | (2006.01) |
| *C23C 16/455* | (2006.01) |
| *C23C 16/458* | (2006.01) |
| *C23C 16/52* | (2006.01) |
| *C30B 25/14* | (2006.01) |
| *C30B 25/16* | (2006.01) |
| *G01F 23/00* | (2022.01) |

(52) U.S. Cl.
CPC .......... *C23C 16/52* (2013.01); *C23C 16/4408* (2013.01); *C23C 16/45525* (2013.01); *C23C 16/4583* (2013.01); *C30B 25/14* (2013.01); *C30B 25/165* (2013.01); *G01F 23/0007* (2013.01)

(58) Field of Classification Search
CPC ....... C30B 25/08; C30B 29/403; C30B 25/14; C30B 25/165; C23C 16/303; C23C 16/4482; C23C 16/52; C23C 16/4408; C23C 16/45525; C23C 16/4583; C23C 16/448; C23C 16/45544; C23C 16/455; C23C 16/4481; G01F 23/0007; G01F 23/04; B01J 4/008; B67D 7/3263; B67D 7/0238
USPC ................. 118/726; 261/DIG. 65, 75, 119.1; 122/33, 40; 137/202
See application file for complete search history.

(56) References Cited

U.S. PATENT DOCUMENTS

| | | | |
|---|---|---|---|
| 5,252,134 A | 10/1993 | Stauffer | |
| 5,562,132 A * | 10/1996 | Siegele | ..................... F17C 5/06 141/95 |

(Continued)

FOREIGN PATENT DOCUMENTS

| | | |
|---|---|---|
| EP | 1006219 A1 | 6/2000 |
| TW | 538003 B | 6/2003 |

*Primary Examiner* — Rudy Zervigon
(74) *Attorney, Agent, or Firm* — Snell & Wilmer L.L.P.

(57) ABSTRACT

A chemical vessel is disclosed comprising a dip tube and a level sensor tube arranged in an elongated counterbore incorporated into a housing of the chemical vessel. The chemical vessel may be configured to allow a pushback routine to take place, whereby a level of liquid in the chemical vessel is reduced to a point that the dip tube is free from liquid inside the dip tube or at the bottom of the dip tube. Once the dip tube is free of the liquid, then a vacuum source may be used to purge vapor within the chemical vessel without the risk of damage to the vacuum source.

20 Claims, 7 Drawing Sheets

Related U.S. Application Data

(60) Provisional application No. 62/844,715, filed on May 7, 2019.

(56) References Cited

U.S. PATENT DOCUMENTS

| | | | |
|---|---|---|---|
| 6,077,356 A * | 6/2000 | Bouchard | C23C 16/4482 222/61 |
| 6,122,931 A | 9/2000 | Paganessi et al. | |
| 6,953,047 B2 | 10/2005 | Birtcher et al. | |
| 9,709,432 B2 | 7/2017 | Dietschi et al. | |
| 10,494,250 B2 | 12/2019 | Ware et al. | |
| 10,676,341 B2 | 6/2020 | Tom et al. | |
| 2004/0262327 A1 | 12/2004 | Birtcher et al. | |
| 2006/0133955 A1 | 6/2006 | Peters | |
| 2008/0143002 A1 * | 6/2008 | Steidl | C23C 16/448 261/122.1 |
| 2008/0168946 A1 | 7/2008 | Nam et al. | |
| 2008/0182010 A1 | 7/2008 | Spohn et al. | |
| 2008/0182425 A1 | 7/2008 | Spohn et al. | |
| 2021/0041284 A1 | 2/2021 | Yednak | |

* cited by examiner

CHEMICAL SOURCE VESSEL WITH DIP TUBE

CROSS-REFERENCE TO RELATED APPLICATIONS

This application is a continuation of, and claims priority to and the benefit of, U.S. patent application Ser. No. 16/860,973, filed Apr. 28, 2020 and entitled "CHEMICAL SOURCE VESSEL WITH DIP TUBE," which is a Non-Provisional of, and claims priority to and the benefit of, U.S. Provisional Patent Application No. 62/844,715, filed May 7, 2019 and entitled "CHEMICAL SOURCE VESSEL WITH DIP TUBE," which are hereby incorporated by reference.

FIELD OF INVENTION

The present disclosure generally relates to an apparatus for processing semiconductor wafers. More particularly, the disclosure relates to a vessel in the apparatus for providing a vaporized gas precursor from a liquid source used for depositing a film on a semiconductor wafer in an atomic layer deposition (ALD) process, a chemical vapor deposition (CVD) process, or an epitaxial deposition process, for example.

BACKGROUND OF THE DISCLOSURE

In film deposition systems, gases are passed over semiconductor wafers, whereby the gases may react with other gaseous precursors in order to form a particular film. The gases may be produced from vaporizing liquid in a vessel.

The vessel may include a refill line to ensure that the vessel has a sufficient amount of liquid source needed to provide a requisite amount of gaseous precursors. The vessel may be filled with an inlet valve attached to a dip tube. The vessel may also have an outlet valve through which gas or liquid may exit the vessel. An example of such a vessel may be disclosed in U.S. Pat. No. 6,077,356, entitled "Reagent Supply Vessel for Chemical Vapor Deposition," which is hereby incorporated by reference. The vessel may include a dip tube as well as a liquid level sensor.

A chemical vessel 100 known in the art is illustrated in FIG. 1. The chemical vessel 100 comprises a vessel housing 110, a level sensor tube 120, a plurality of level sensors 130A-130D, a dip tube 140, a valve 150, and a gas or vacuum source 160. Within the vessel housing 110, a notch 170 is formed. The chemical vessel 100 may be used to store a liquid chemical that may later be vaporized into a gas for use in a film deposition process.

The plurality of level sensors 130A-130D may be located at particular spots along the level sensor tube 120 to indicate that a liquid inside the vessel housing 110 is at a particular level. For example, a reading at level sensor 130A may indicate that the liquid inside the vessel housing 110 is at a 75% level, a reading at level sensor 130B may indicate that the liquid inside the vessel housing 110 is at a 65% level, a reading at level sensor 130C may indicate that the liquid inside the vessel housing 110 is at a 15% level, and a reading at level sensor 130D may indicate that the liquid inside the vessel housing 110 is at a 10% level.

Into the notch 170, the level sensor tube 120 may extend, but not the dip tube 140. Because the dip tube 140 does not extend into the notch 170, this may result in a large amount of liquid in the vessel after the vacuum or gas source 160 pushes liquid down through the dip tube 140.

In addition, the refill line, which is the same line as the dip tube (along with other lines and tubes attached to the vessel), may undergo processes to remove liquid source through application of input gas and vacuum. When the vacuum is applied, it is desirable to ensure that the dip tube is free of any liquid both inside and below this tube, as the presence of any liquid in the dip tube would result in liquid going through the pump. The pump could then be damaged and create a safety issue for operating personnel.

As a result, a vessel utilized for processing semiconductor wafers that prevents liquid in the vessel from being drawn back through the dip tube is desired. In addition, a method for verification that a liquid level is below the dip tube is also desired.

SUMMARY OF THE DISCLOSURE

In accordance with one embodiment of the invention, a chemical vessel for providing a chemical precursor for use in deposition of semiconductor films onto a substrate is disclosed. The chemical vessel comprises: a vessel housing; a counterbore built into a bottom of the vessel housing; a level sensor tube extending from a top of the vessel housing substantially into the counterbore, the level sensor tube comprising a plurality of level sensors indicating a level of chemical precursor within the vessel housing; a dip tube extending from a top of the vessel housing to substantially a top of the counterbore; a vacuum source coupled to the dip tube; and a vacuum valve connecting the vacuum source to the dip tube; wherein the vacuum source is configured to remove a vapor of the chemical precursor from the vessel housing.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which may react and/or decompose on a substrate surface to produce a desired deposition.

Figure 1:
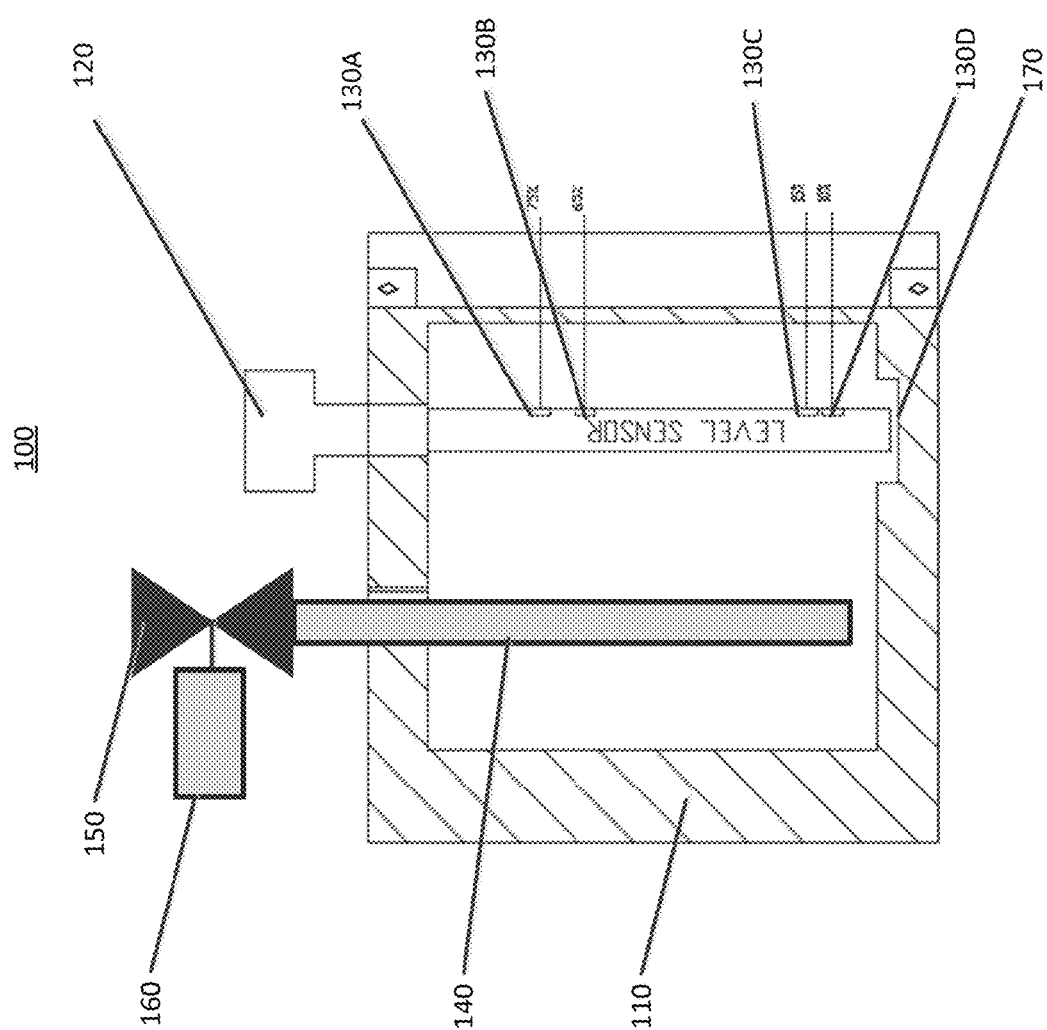
FIG. 1 is a cross-sectional illustration of a prior art chemical vessel.
Figure 2:
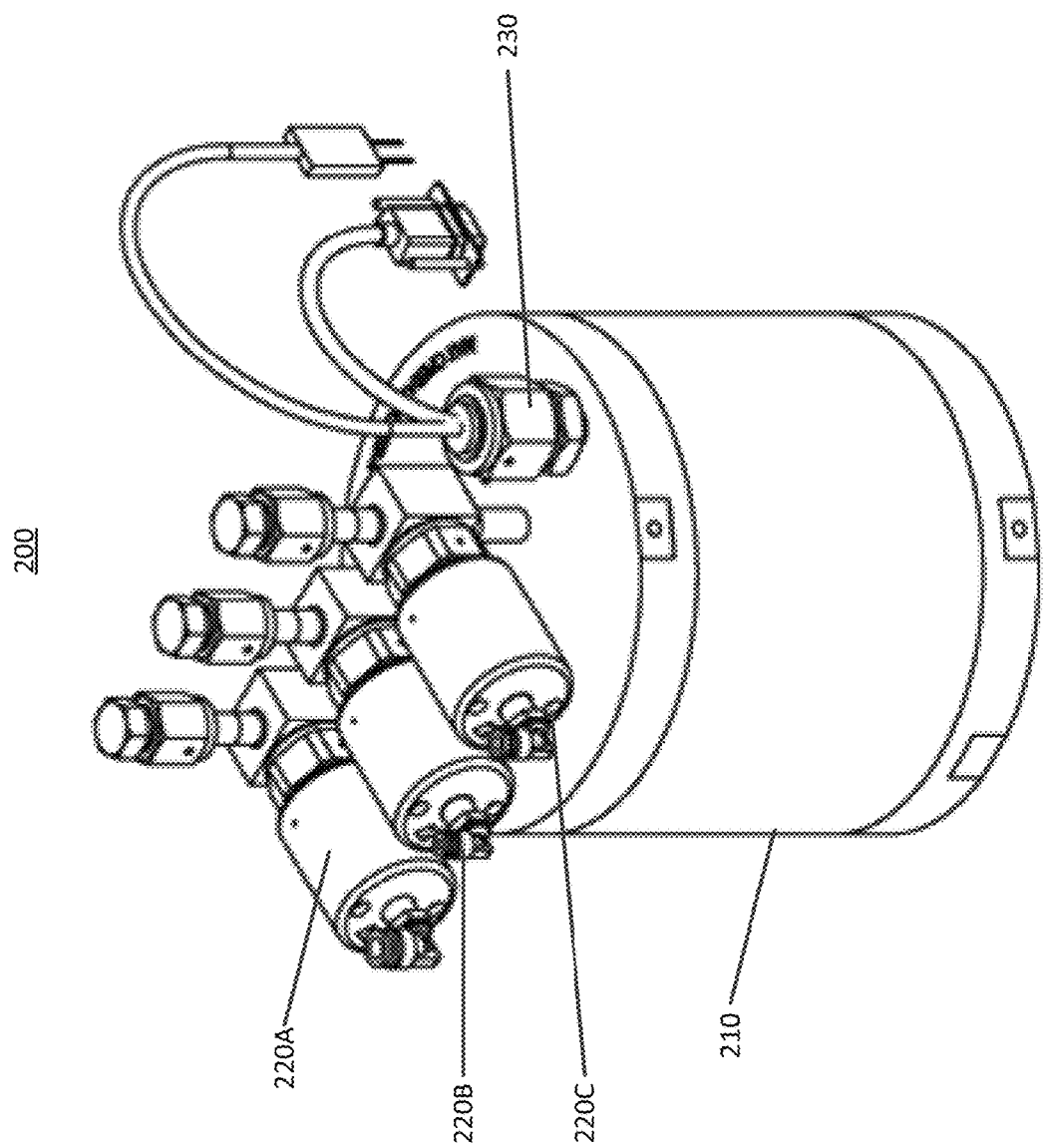
FIG. 2 is a perspective illustration of a chemical vessel in accordance with at least one embodiment of the invention.

Chemical vessels may be used to hold a liquid precursor that is later vaporized when used to form a film. FIG. 2 illustrates a chemical vessel 200 in accordance with at least one embodiment of the invention. The chemical vessel 200 comprises a vessel housing 210, a first valve 220A, a second valve 220B, a third valve 220C, and a level sensor tube port 230.

The first valve 220A may be connected to a gas source (not illustrated). The second valve 220B may be connected to a vacuum source or a liquid source (not illustrated). The third valve 220C may be connected to a reaction chamber (not illustrated), where deposition of a film may take place. Each of first valve 220A, second valve 220B, and/or third valve 220C may comprise a manual or pneumatic valve. The level sensor tube port 230 may allow for electrical connections to a controller, to a processor, or to a heating element (not illustrated).

Figure 3A:
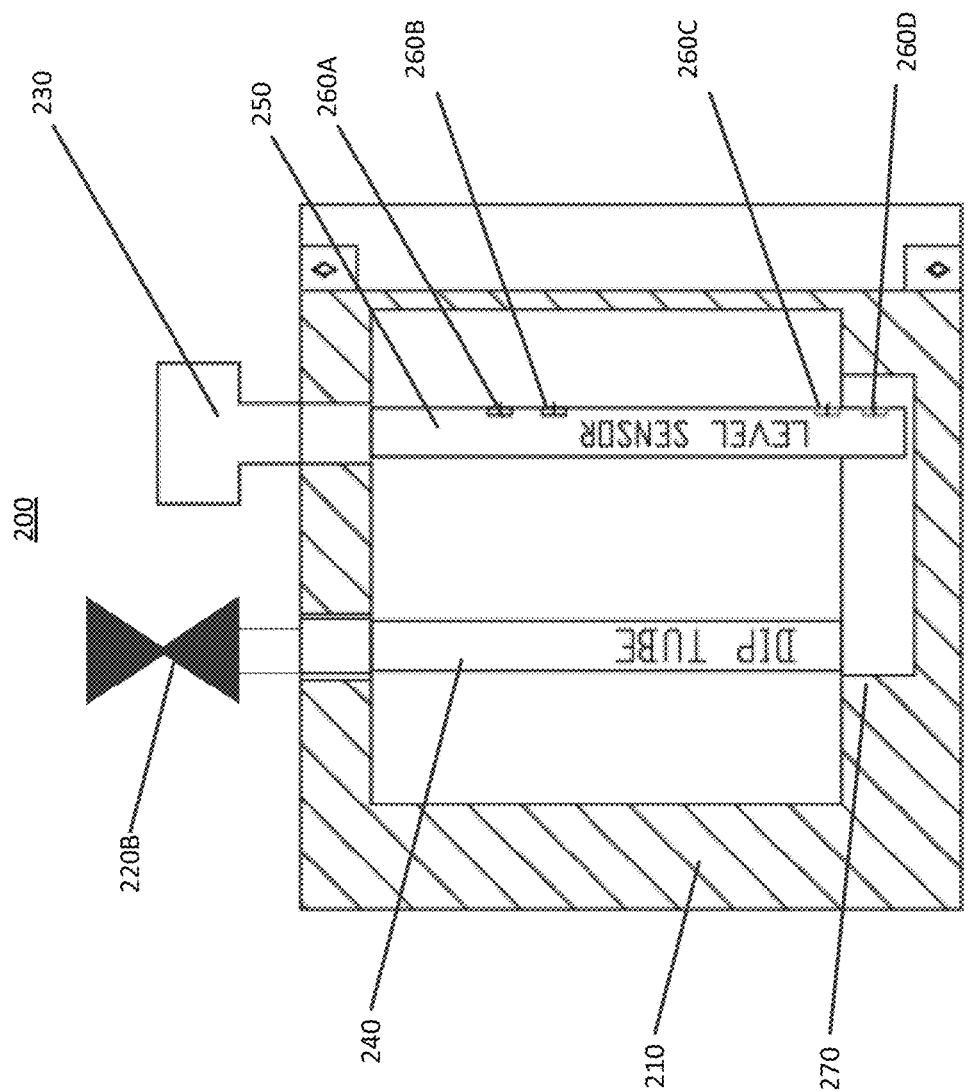
FIGS. 3A-3C are cross-sectional illustrations of a chemical vessel in accordance with at least one embodiment of the invention.

The chemical vessel 200 may include additional parts illustrated in FIG. 3A. The chemical vessel 200 may also include a dip tube 240, a level sensor tube 250, a plurality of level sensors 260A-260D, and a counterbore 270. The dip tube 240 may be attached to the second valve 220B. The level sensor tube 250 may be connected to the level sensor tube port 230. The counterbore 270 may be a notch formed within a bottom of the vessel housing 210. The level sensor tube 250 may extend substantially into the counterbore 270, while the dip tube 240 may extend to approximately the top of the counterbore 270.

The plurality of level sensors 260A-260D may be located at particular spots along the level sensor tube 250 to indicate that a liquid inside the vessel housing 210 is at a particular level. For example, a reading at level sensor 260A may indicate that the liquid inside the vessel housing 210 is at a 75% level, a reading at level sensor 260B may indicate that the liquid inside the vessel housing 210 is at a 65% level, a reading at level sensor 260C may indicate that the liquid inside the vessel housing 210 is at a 5% level, and a reading at level sensor 260D may indicate that the liquid inside the vessel housing 210 is at a 1% level.

Figure 3B:
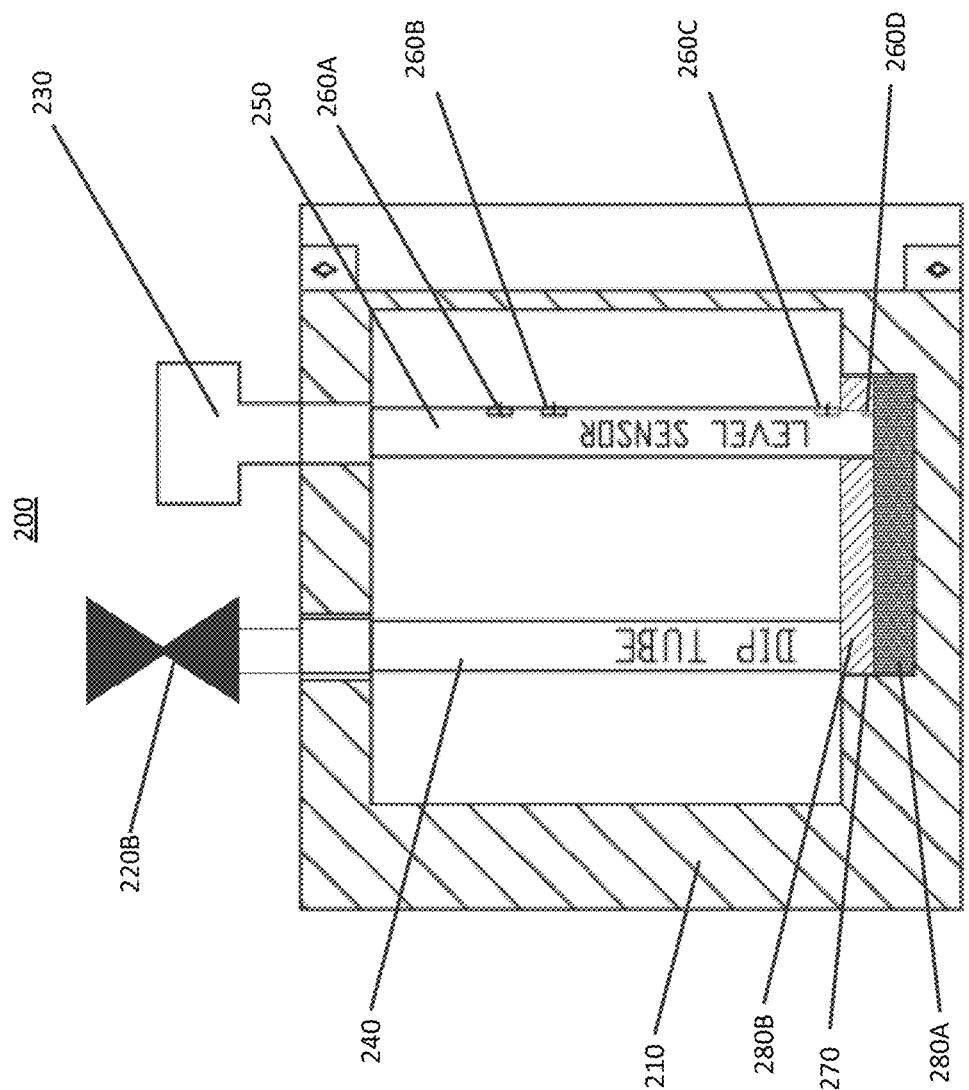

The chemical vessel 200 may operate in a situation illustrated in FIG. 3B. The counterbore 270 may be filled with a safe amount of liquid precursor 280A and an excess amount of liquid precursor 280B. The excess amount of liquid precursor 280B has the potential to be sucked up within the dip tube 240 as the second valve 220B may be connected to a vacuum source. The vacuum source may be connected to a pump, which may be adversely affected by the excess amount of liquid precursor 280B.

Figure 3C:
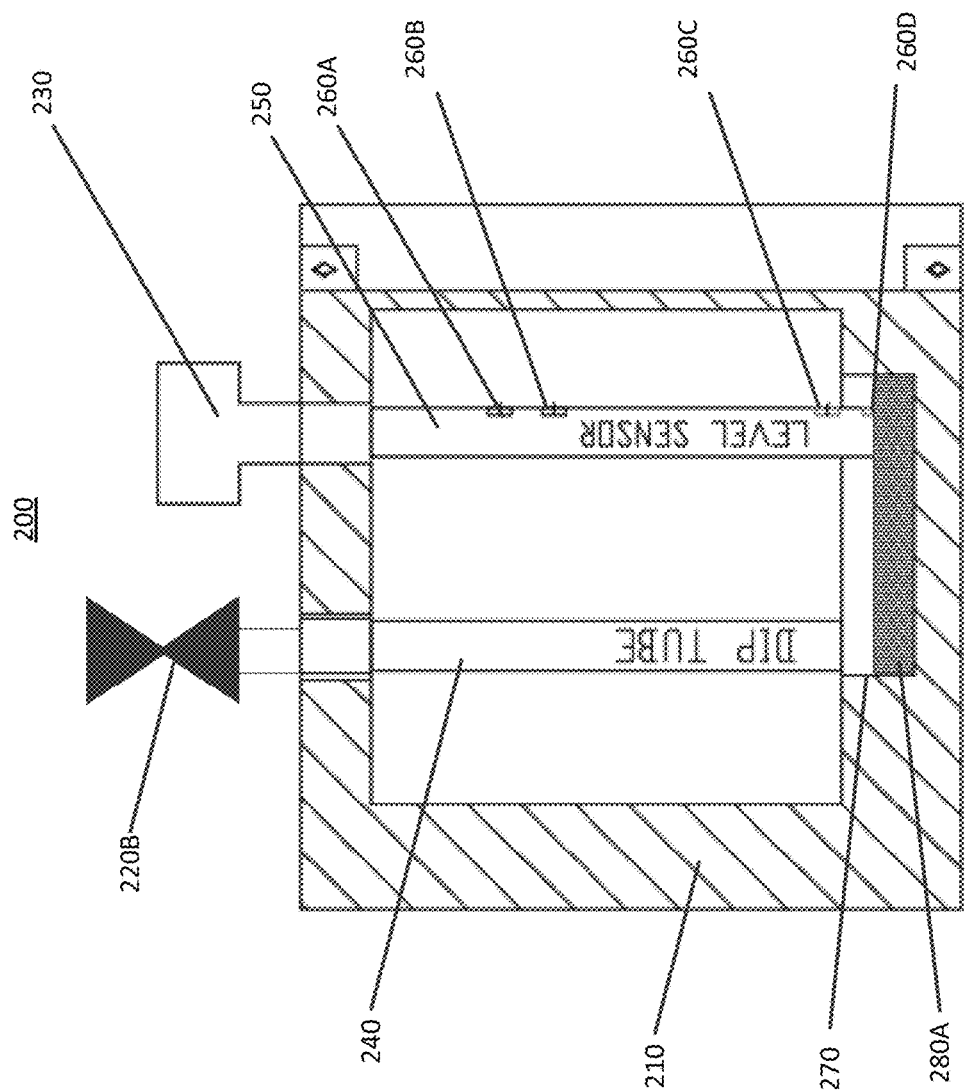

As a result, the excess amount of liquid precursor 280B may be removed through a process of operating the first valve 220A and the third valve 220C. The safe amount of liquid precursor 280A may be reflected as the amount that would reach the level sensor as reflected in FIG. 3C. Once the level of liquid precursor in the vessel is at the safe amount 280A, a vacuum source may be operatively connected to the second valve 220B and the dip tube 240 safely without any of the liquid precursor going up the dip tube 240.

Figure 4:
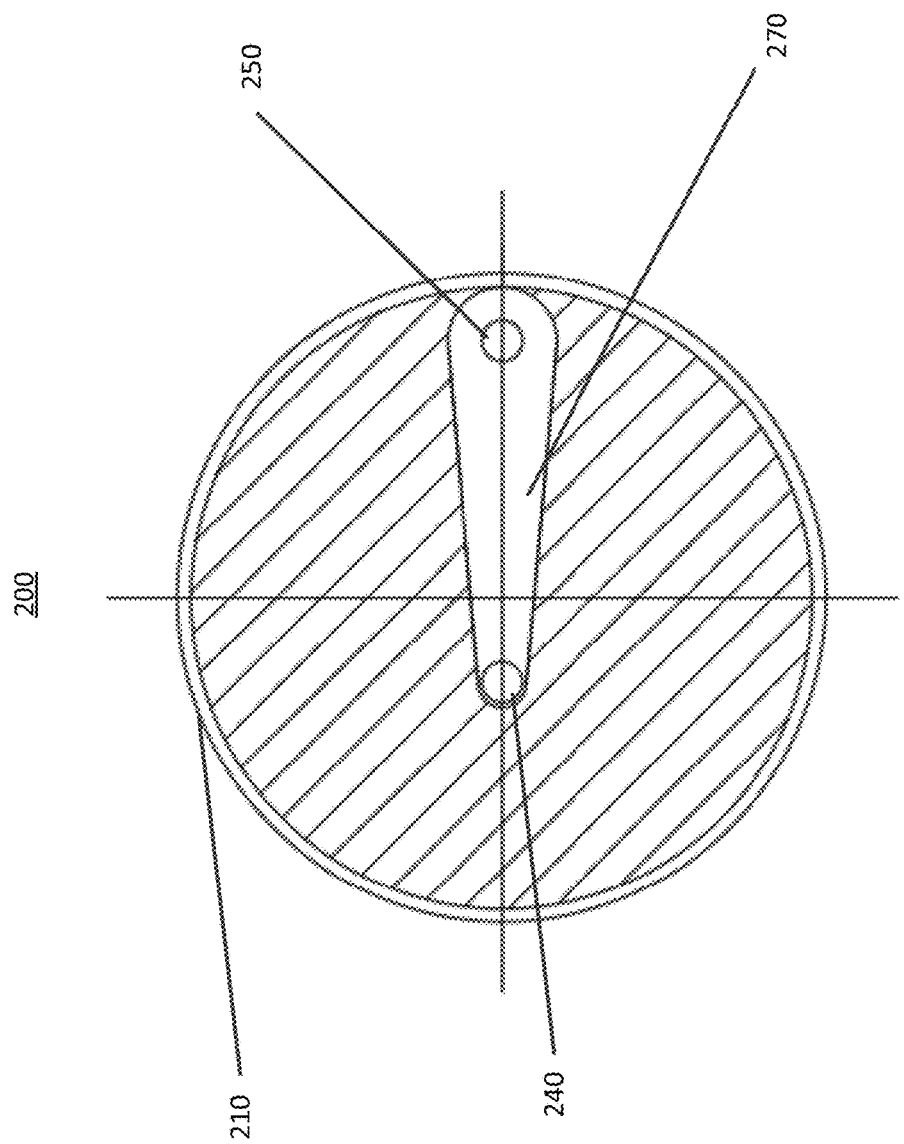
FIG. 4 is a top-down perspective illustration of a chemical vessel in accordance with at least one embodiment of the invention.

FIG. 4 illustrates a shape of the counterbore 270 within the vessel housing 210. The counterbore 270 may be shaped in other ways, such as an ellipse, a circle, or a rectangle, for example. One of ordinary skill in the art may employ any shape for the counterbore 270 so long as the area encompasses both the area under the dip tube 240 and the level sensor tube 250.

Figure 5:
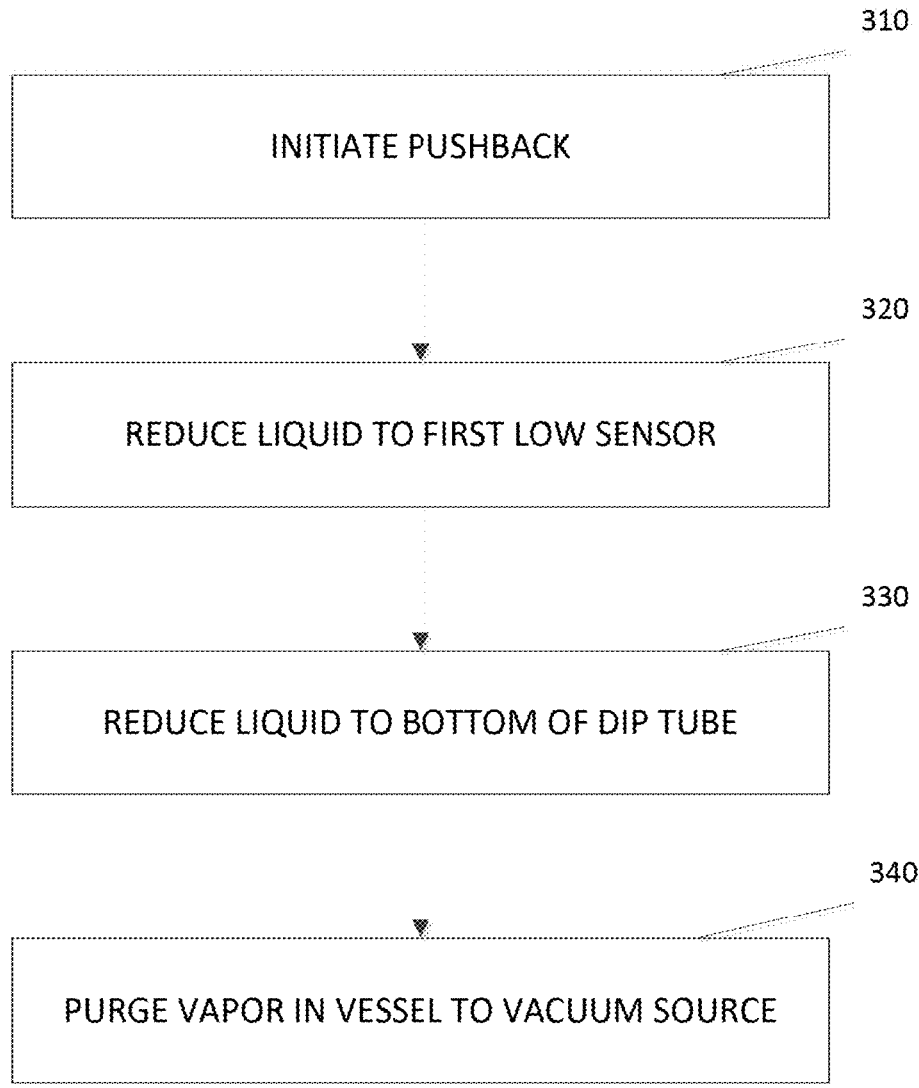
FIG. 5 illustrates a method in accordance with at least one embodiment of the invention.

The chemical vessel 200 may be operated in different ways. The chemical vessel 200 may be refilled during a process and also may be emptied as well. A process 300 for operating the chemical vessel 200 is illustrated in FIG. 5 in accordance with at least one embodiment of the invention. Operating the process 300 may not only ensure that liquid cannot be drawn back through the dip tube 240, but also allow for a purge routine to be run in the chemical vessel 200 in allowing for safe removal of the chemical vessel 200 during maintenance.

The process 300 results in removal of a liquid precursor in the vessel housing 210 to a remote located liquid source. The process 300 may comprise an initiate pushback step 310, a reduce liquid to the first low sensor step 320, a reduce liquid to the bottom of the dip tube step 330, and a purge vapor step 340. During the initiate pushback step 310, liquid precursor in the vessel housing 210 may exit the dip tube 240. The reduce liquid to the first low sensor step 320 may result in the level of liquid precursor being at the level sensor 260C. The reduce liquid to the bottom of the dip tube 330 may result in the level of liquid precursor being at the level sensor 260D.

At this point, the level of liquid precursor may be at the safe amount 280A. The second valve 220B may be opened and a vacuum may be employed to remove vapor within the chemical vessel 200.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A chemical vessel for providing a chemical precursor, comprising:
   a vessel housing;
   a counterbore built into a bottom of the vessel housing;
   a level sensor tube extending from a top of the vessel housing into the counterbore, the level sensor tube comprising a plurality of level sensors indicating a level of chemical precursor within the vessel housing; and
   a dip tube extending from the top of the vessel housing to approximately a top of the counterbore,
   wherein a length of the level sensor tube within the vessel housing is greater than a length of the dip tube within the vessel housing.

2. The chemical vessel of claim 1, further comprising:
   a vacuum source coupled to the dip tube; and
   a vacuum valve connecting the vacuum source to the dip tube.

3. The chemical vessel of claim 2, wherein the vacuum source is configured to remove a vapor of the chemical precursor from the vessel housing.

4. The chemical vessel of claim 1, wherein the counterbore comprises one of a rectangular, circular, or elliptical shape.

5. The chemical vessel of claim 1, wherein each of the plurality of level sensors is disposed at a different location on the level sensor tube.

6. The chemical vessel of claim 1, further comprising a reaction chamber valve configured to send a vaporized chemical precursor to a reaction chamber.

7. The chemical vessel of claim 1, further comprising an inlet valve coupled to the vessel housing and a gas source.

8. The chemical vessel of claim 1, further comprising a level sensor port to which the level sensor tube is coupled.

9. A reaction system, comprising:
   the chemical vessel of claim 1;
   a reaction chamber; and
   a substrate holder disposed within the reaction chamber and configured to hold at least one substrate.

10. A chemical vessel for providing a chemical precursor, comprising:
    a vessel housing;
    a counterbore built into a bottom of the vessel housing;
    a level sensor tube extending from a top of the vessel housing into the counterbore; and
    a dip tube extending from the top of the vessel housing,
    wherein a length of the level sensor tube within the vessel housing is greater than a length of the dip tube within the vessel housing.

11. The chemical vessel of claim 10, wherein the level sensor tube comprises a plurality of level sensors indicating a level of the chemical precursor within the vessel housing.

12. The chemical vessel of claim 11, wherein each of the plurality of level sensors is disposed at a different location on the level sensor tube.

13. The chemical vessel of claim 12, wherein one of the plurality of level sensors is disposed in the counterbore.

14. The chemical vessel of claim 13, wherein one of the plurality of level sensors is disposed at a top of the counterbore.

15. The chemical vessel of claim 10, further comprising:
    a vacuum source coupled to the dip tube; and
    a vacuum valve connecting the vacuum source to the dip tube,
    wherein the vacuum source is configured to remove a vapor of the chemical precursor from the vessel housing.

16. The chemical vessel of claim 10, further comprising:
    an inlet valve coupled to the vessel housing and a gas source; and
    a level sensor port to which the level sensor tube is coupled.

17. A reaction system, comprising:
    the chemical vessel of claim 10;
    a reaction chamber; and
    a substrate holder configured to hold at least one substrate.

18. A chemical vessel, comprising:
    a vessel housing;
    a counterbore built into a bottom of the vessel housing;
    a level sensor tube extending from a top of the vessel housing into the counterbore, the level sensor tube comprising at least one level sensor indicating a level of chemical precursor within the vessel housing; and
    a dip tube extending from the top of the vessel housing to approximately a top of the counterbore,
    wherein the level sensor tube extends further downward within the vessel housing than the dip tube.

19. The chemical vessel of claim 18, wherein a level sensor of the at least one level sensor is disposed in the counterbore.

20. The chemical vessel of claim 18, further comprising:
    a vacuum source coupled to the dip tube; and
    a vacuum valve connecting the vacuum source to the dip tube.

* * * * *